(12) United States Patent
Raberg et al.

(10) Patent No.: US 10,649,010 B2
(45) Date of Patent: May 12, 2020

(54) CURRENT SENSING

(71) Applicant: Infineon Technologies AG, Neubiberg (DE)

(72) Inventors: Wolfgang Raberg, Sauerlach (DE); Goran Keser, Munich (DE); Matthias Rose, Kirchseeon (DE); Rainer Markus Schaller, Saal a.d. Donau (DE)

(73) Assignee: Infineon Technologies AG, Neubiberg (DE)

( * ) Notice: Subject to any disclaimer, the term of this patent is extended or adjusted under 35 U.S.C. 154(b) by 526 days.

(21) Appl. No.: 15/385,694

(22) Filed: Dec. 20, 2016

(65) Prior Publication Data
US 2018/0172739 A1 Jun. 21, 2018

(51) Int. Cl.
*G01R 15/20* (2006.01)
*G01R 17/10* (2006.01)
*H01L 21/00* (2006.01)

(52) U.S. Cl.
CPC ........... *G01R 15/205* (2013.01); *G01R 17/10* (2013.01); *H01L 21/00* (2013.01)

(58) Field of Classification Search
CPC ....... G01R 1/00; H01L 21/00; H01L 2221/00; G01D 1/00
See application file for complete search history.

(56) References Cited

U.S. PATENT DOCUMENTS

| | | | |
|---|---|---|---|
| 9,448,258 B2 * | 9/2016 | Garabieta | G01R 15/181 |
| 2005/0156587 A1 * | 7/2005 | Yakymyshyn | G01R 15/207 |
| | | | 324/117 R |
| 2009/0021249 A1 * | 1/2009 | Kumar | G01R 33/07 |
| | | | 324/227 |
| 2011/0227560 A1 * | 9/2011 | Haratani | B82Y 25/00 |
| | | | 324/117 R |
| 2012/0019236 A1 * | 1/2012 | Tiernan | G01N 27/9033 |
| | | | 324/234 |
| 2013/0008022 A1 * | 1/2013 | Yao | G01R 33/09 |
| | | | 29/830 |
| 2014/0167740 A1 * | 6/2014 | Gilbert | G01R 15/181 |
| | | | 324/127 |
| 2015/0212117 A1 * | 7/2015 | Hackner | G01R 33/072 |
| | | | 324/117 H |
| 2016/0258984 A1 * | 9/2016 | Meehleder | G01R 15/183 |

FOREIGN PATENT DOCUMENTS

| | | |
|---|---|---|
| CN | 102866279 A | 1/2013 |
| CN | 105659098 A | 6/2016 |
| WO | 2006136577 A1 | 12/2006 |

OTHER PUBLICATIONS

Weiss, et al., "Technology demonstrator for novel digital current sensor," DCC+G Consortium, Apr. 1, 2012, 28 pp.
Office Action, in the Chinese language, from counterpart Chinese Application No. 201711385345.3, dated Dec. 3, 2019, 18 pp.

* cited by examiner

*Primary Examiner* — Huy Q Phan
*Assistant Examiner* — Temilade S Rhodes-Vivour
(74) *Attorney, Agent, or Firm* — Shumaker & Sieffert, P.A.

(57) ABSTRACT

Methods and devices related to current sensing are provided. Magnetoresistive sensor elements are provided on opposite sides of a conductor.

22 Claims, 8 Drawing Sheets

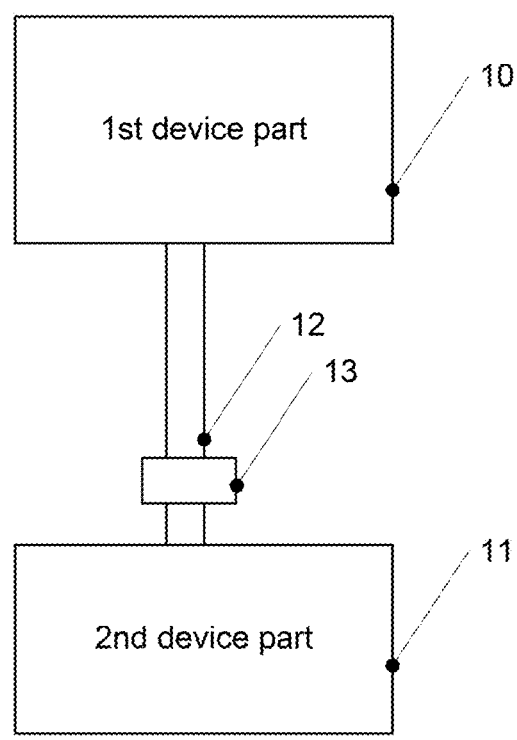
Fig. 1
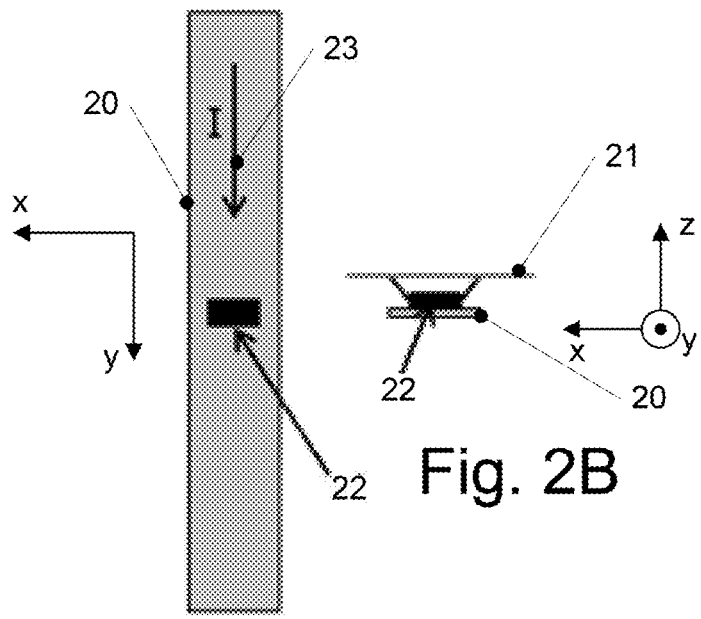
Fig. 2A
Fig. 2B

CURRENT SENSING

TECHNICAL FIELD

The present application relates to devices and methods for current sensing.

BACKGROUND

In various applications in the electrical field, currents flowing within or between devices or parts thereof need to be measured. In some applications, for example in electrical vehicles and other high power devices, accurate measurements of electric currents over a wide range of current values, for example from a few Milliampere (mA) up to a few Kiloampere (kA) are required. Furthermore, currents up to a few Kiloampere usually require electrical conductors having a comparatively high cross-section to minimize losses and heating. Conventionally, sensing of such large currents is for example done by closed-loop Hall sensors using magnetic flux concentrators. Such sensors are comparatively large, heavy and have comparatively high costs. Another approach involves the use of shunt resistors, for which these considerations also apply and which shunt resistors in addition are not galvanically isolated from the current and have a low tolerance against stray fields due to sensitivity to electromagnetic interference.

SUMMARY

According to an embodiment, a device is provided, comprising:
an electrical conductor, and
a plurality of magnetoresistive sensor elements, wherein a first subset of the plurality of magnetoresistive sensor elements is provided on a first side of the electrical conductor, and a second subset of the plurality of magnetoresistive sensor elements is provided on a second side of the electrical conductor opposite the first side.

According to another embodiment, a method is provided, comprising:
providing an electrical conductor, and
providing magnetoresistive sensor elements on opposite sides of the electrical conductor.

According to another embodiment, a device is provided, comprising:
an electrical conductor,
a first housing comprising a first magnetoresistive sensor element and a second magnetoresistive sensor element, wherein the first housing is provided on a first side of the electrical conductor,
a second housing comprising a third magnetoresistive sensor element and a fourth magnetoresistive sensor element, the second housing being provided on a second side of the electrical conductor opposite the first side, and
electrical connections connecting the first through fourth magnetoresistive sensor elements in a bridge configuration.

The above summary is merely intended to give a brief overview over some possible embodiments and is not to be construed as limiting.

BRIEF DESCRIPTION OF THE DRAWINGS

FIG. 1 is an example device according to an embodiment.

FIG. 2A is a plan view of a magnetic field sensor associated with a conductor.

FIG. 2B is a cross-sectional view of the magnetic field sensor and conductor of FIG. 2A.

DETAILED DESCRIPTION

Figure 3:
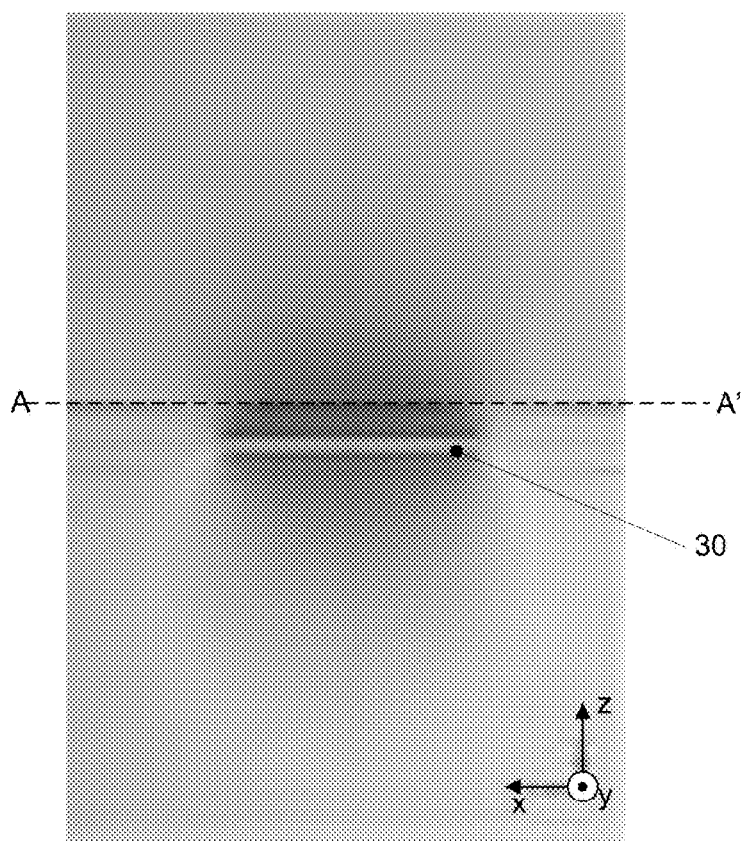
FIG. 3 is a diagram illustrating a magnetic field distribution around a conductor.

In the following, various embodiments will be discussed in detail referring to the attached drawings. These embodiments are given by way of example only and are not to be construed as limiting. For example, while embodiments may be described as comprising numerous features, details or elements, in other embodiments some of these features, details or elements may be omitted or may be replaced by alternative features, details or elements. Furthermore, apart from the features, details and elements shown in the drawings or described herein, further features, elements or components not explicitly shown and described may be provided without departing from the scope of the present disclosure, for example components conventionally used in current sensing.

Features or elements from different embodiments may be combined unless noted otherwise. Variations and modifications described with respect to one of the embodiments may also be applicable to other embodiments.

Some embodiments discussed herein relate to techniques for sensing current using magnetoresistive sensors. Magnetoresistive sensors are sensors which use a magnetoresistive effect which changes their electrical resistance responsive to a magnetic field. Magnetoresistive effects usable for such sensors include the anisotropic magnetoresistive effect (AMR), the giant magnetoresistive effect (GMR), or the tunnel magnetoresistive effect (TMR). These effects will generically be referred to as XMR effects herein, and corresponding sensors, devices and elements etc. using an XMR effect will be referred to as XMR sensors, devices, elements etc. Conductors as used herein refer to electrical conductors, i.e. structures, materials, devices etc. conducting electrical current.

In embodiments, a plurality of XMR sensor elements, for example at least four XMR sensor elements or two XMR elements in combination with two (non-XMR) resistive elements like reference resistors or other components effectively acting as resistors, are used to measure a current in a galvanically isolated manner. A current flowing through a conductor generates a magnetic field, which may be sensed by the XMR sensor elements. The conductor may be a straight conductor at least in a section of the conductor where the current is measured (i.e. no bends, curves or the like in that section) and/or may be a bar-shaped conductor, but is not limited thereto. A first subset of the XMR sensor elements may be mounted on a first side of the conductor, and a second subset of the XMR sensor elements may be mounted on a second side opposite the first side. A subset, in this respect, refers to one or more of the plurality of XMR sensor elements, but not to all of them. The plurality of XMR sensor elements or combination of XMR sensor elements and resistive elements may be coupled in a bridge configuration, for example in a Wheatstone bridge configuration. This may help to eliminate effects from stray magnetic fields in some embodiments.

Embodiments disclosed herein may be used for measuring currents in a variety of applications, including automotive applications, measurement of currents supplied from power grids, generators, transformers, batteries, solar panels, windmills, regenerative braking systems, hydro-electrical or wind-powered generators or any other form of devices that are capable of providing electrical power. For example, current measurements may be performed in automotive applications like a charger for an electric car, where current sensing is an important factor, or in battery management systems, for example in a vehicle containing batteries and/or an electric motor, in order to use operational current levels including a way down to a leakage current of a vehicle. Further applications of techniques disclosed herein may include power converters like alternating current (AC) to direct current (DC) converters, DC-to-DC converters or DC-to-AC converters, where current measurements may be used to control the power converters. Currents measured may be up to a couple of a hundreds of Amperes or even some Kiloamperes, but may also be larger or smaller currents.

Turning now to the Figures, FIG. 1 is a diagram illustrating a device according to an embodiment, where current sensing techniques as described herein may be employed. The device of FIG. 1 comprises a first device part 10 and a second device part 11. In some embodiments, first device part 10 may include a power source (for example a battery, a generator etc.) and a power switch to selectively turn the power on or off. Second device part 11 may include a load like an electric motor. Electrical power is supplied from first device part 10 to second device part 11 via an electrical conductor 12, for example a bar-shaped conductor. A current measurement device 13 as discussed herein later in more detail is provided to measure a current flowing through conductor 12. The placement of current sensor device 13 on conductor 12 shown in FIG. 1 is only an example, and current sensor device 13 may be placed anywhere on conductor 12 to measure current flowing through conductor 12.

FIG. 2 is a schematic diagram showing a conductor 20 along with a single XMR sensor element 22 to illustrate measuring an electric current by an XMR sensor element. FIG. 2A illustrates a top view of conductor 20, while FIG. 2B illustrates a cross-sectional view. Coordinate systems are illustrated for ease of reference. In this way, FIG. 2A shows a view of the xy-plane, while FIG. 2B shows a cross-section along an xz-plane.

In the example of FIGS. 2A and 2B, a current I as indicated by an arrow 23 flows in the y-direction. Conductor 20 is a bar-shaped conductor, with an extension in the x-direction being greater than an extension in the z-direction. The extension in the x-direction will also be referred to as the width of the conductor 20, and the extension in the z-direction also as the thickness of conductor 20. For example, a width of conductor 20 may be about 14 mm while a thickness may be about 1 mm, although these values serve merely as examples and may for example be selected depending on a current magnitude expected in a particular application. The extension in the y-direction is also referred to as length and may be selected depending on how far the current has to be conducted by conductor 20. In this respect, generally, for higher currents higher cross-sectional areas of conductor (width times thickness) are required to reduce losses and prevent heating.

XMR sensor 22 is mounted adjacent at a side of conductor 20, as best seen in the cross-sectional view of FIG. 2B, and electrically coupled to a carrier 21, for example a printed circuit board (PCB) or direct copper bonding (DCB). XMR sensor 22 may be implemented in any conventional manner, for example as a GMR sensor, an AMR sensor or a TMR sensor. Such sensors in particular may include layer structures of magnetic layers to provide a resistance responsive to a magnetic field.

Current I flowing through conductor 20 generates a magnetic field around conductor 20 having for example a component in the x-direction. By orientating XMR sensor 22 accordingly, this field component may be measured. Without stray magnetic fields in addition to the magnetic field generated by current 23, there is a direct relationship between the magnetic field measured and the current flowing for a fixed geometrical relationship between XMR sensor 22 and conductor 20.

Figure 4:
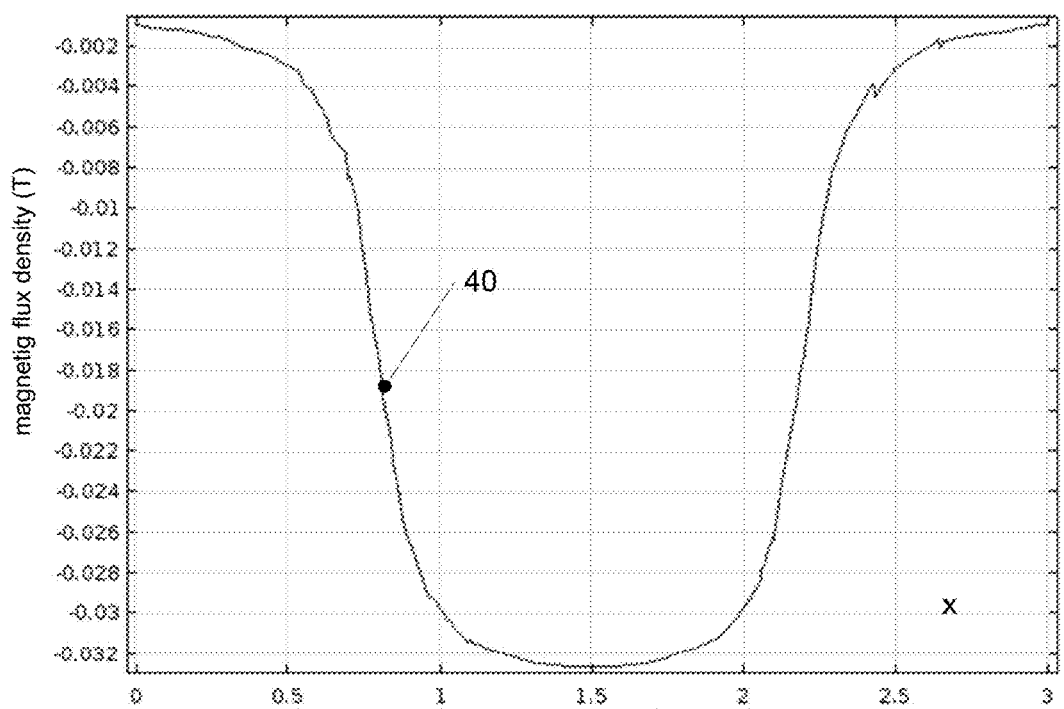
FIG. 4 is a graph illustrating a magnetic field distribution along a line A-A' of FIG. 3.

FIG. 3 shows a plot of simulation results illustrating the magnetic field distribution in the xz-plane for a conductor 30, which in the example shown is a bar-shaped conductor similar to conductor 20 of FIG. 2, and the orientation of the conductor is the same as for conductor 20. In other words, in FIG. 3 the magnetic field distribution in a cross-section of the conductor is shown. FIG. 3 illustrates in particular the magnetic flux density in the x-direction, i.e. parallel to sides of the conductor. A curve 40 in FIG. 4 illustrates the magnetic flux density along a line A-A' in FIG. 3, in about 1 mm distance from the conductor for a conductor having a width of 14 mm and a thickness of 1 mm (simulation results) with a current of 800 A. The magnetic fields above (in z-direction) and below conductor 30 have opposite signs, and, for 800 A, have a flux magnitude of about 33 mT in the simulation illustrated in FIGS. 3 and 4. For lower currents, this flux density drops for example to about 8 mT for 200 A current or 0.4 mT for about 10 A current.

This field distribution with opposite signs of the magnetic field on different sides of a conductor is used in some embodiments to provide current sensors with reduced sensitivity to stray magnetic field.

Figure 5:
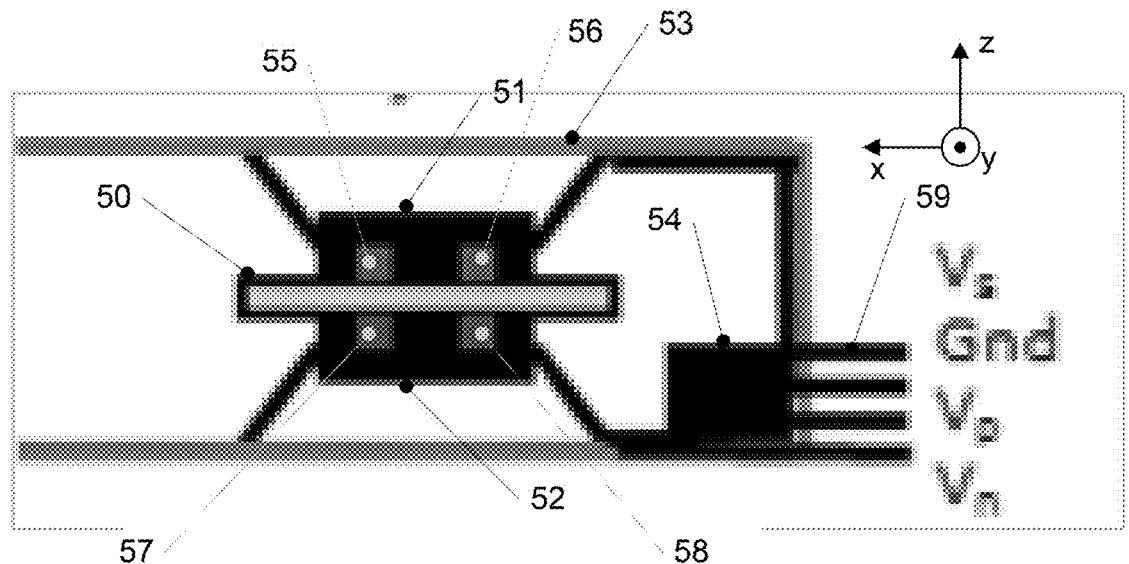
FIG. 5 is a cross-sectional view of a device according to an embodiment.

FIG. 5 illustrates a cross-sectional view (in the xz-plane taking the coordinate systems of FIG. 2) of a device according to an embodiment to measure a current in the positive or negative y-direction.

The device of FIG. 5 in one implementation comprises a first XMR sensor element 55, a second XMR sensor element 56, a third XMR sensor element 57 and fourth XMR sensor element 58. First and second XMR sensor elements 55, 56 are provided at, i.e. on or above, a first side of conductor 50, and third and fourth XMR sensor elements 57, 58 are provided at, i.e. on or above, a second side of conductor 50, the first side being opposite to the second side, as illustrated in FIG. 5. First and second XMR sensor elements 55, 56 may be provided in a first housing 51, and third and fourth XMR sensor elements 57, 58 may be provided in a second housing 52. In other embodiments, for example, each of sensor elements 55 to 58 may be provided in its own separate housing. First to fourth XMR sensor elements 55-58 are arranged and orientated to be sensitive to a magnetic field in the x-direction.

First through fourth sensor elements 55-58 are electrically coupled via a support 53, for example a printed circuit board, to a plug 54 which enables electrical connection to further devices via pins 59. While pins 59 are shown in FIG. 5, any other type of electrical connection, for example a socket instead of a plug, may be provided. Furthermore, via electrical connections, for example on support 53 or in plug 54, XMR sensor elements 55 to 58 are coupled with each other in a bridge configuration (Wheatstone bridge) as shown in a circuit diagram in FIG. 6. In operation, a supply voltage, VS, and ground Gnd are supplied, and a differential measurement signal $V_p$, $V_n$ is generated.

With the configuration of FIG. 5 with first and second XMR sensor elements 55, 56 mounted at the first side of conductor 50 and third and fourth XMR sensor elements 57, 58 mounted at the second side of conductor 50, XMR sensor elements 55, 56 are subjected to a magnetic field essentially in opposite direction as XMR sensor elements 57, 58. With the coupling shown in FIG. 6, the polarities are such that the sensed magnetic fields on both sides add each other up to yield a measurement signal. On the other hand, in case of a stray magnetic field, first through fourth XMR sensor elements at least approximately experience a magnetic field in the same direction as long as variations of the magnetic stray fields occur on a scale larger than a distance between first through fourth XMR sensor elements 55-58, which is typical for many stray field situations. In this case, the measured magnetic field components of the stray magnetic field cancel each other out through the configuration in FIG. 6, such that the influence of stray magnetic fields on the current measurements is at least significantly reduced.

Figure 6:
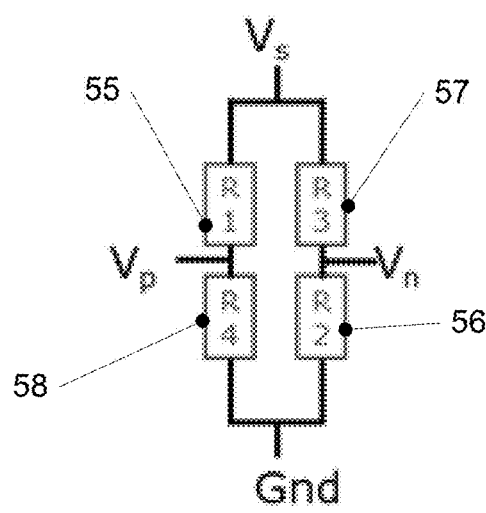
FIG. 6 is an equivalent circuit of part of the device of FIG. 5.

In another implementation, in FIGS. 5 and 6, only two of elements 55-58 are XMR sensor elements, for example elements 55 and 57, and therefore exhibit a resistance depending on the current flowing through conductor 50. The other two of elements 55-58, for example elements 56 and 58, in this implementation may be resistive elements essentially insensitive to the current flowing through conductor 50 and the magnetic field generated thereby, for example reference resistors. The operation of this implementation is essentially the same as for the implementation with four XMR sensor elements 55-58 described above.

Figure 10:
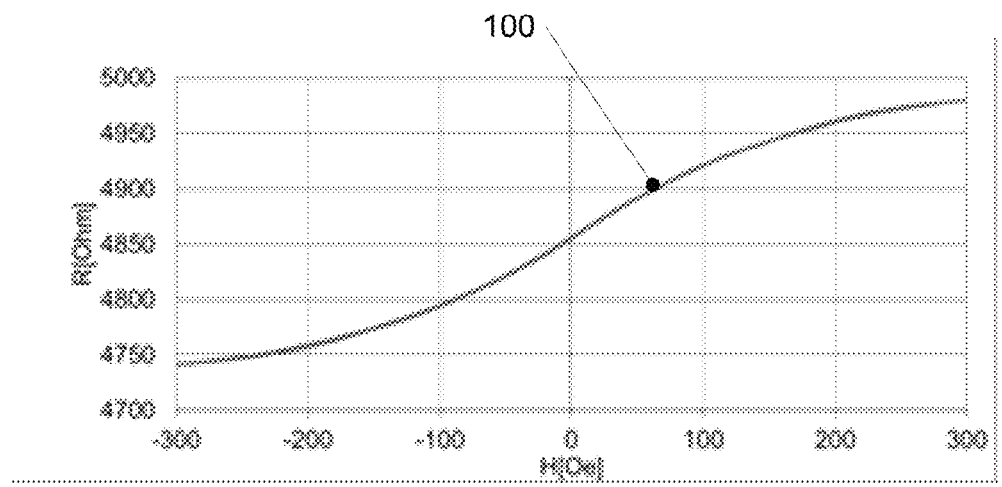
FIG. 10 illustrates a sensitivity curve for a magnetoresistive sensor usable in some embodiments.

To give an example, FIG. 10 shows an exemplary transfer curve of a Vortex-based GMR resistor as a function of magnetic field H. A vortex-based GMR resistor has a vortex-like magnetization and is one type of conventional XMR sensor elements, which has a low hysteresis, usable in some embodiments. However, other implementations of XMR sensor elements may also be used in embodiments. With those transfer curves where the resistance of the respective XMR sensor element has a well-defined dependence on the magnetic field generated by the current flowing through the conductor, a precise current measurement is possible for example with the embodiment of FIGS. 5 and 6.

Figure 7:
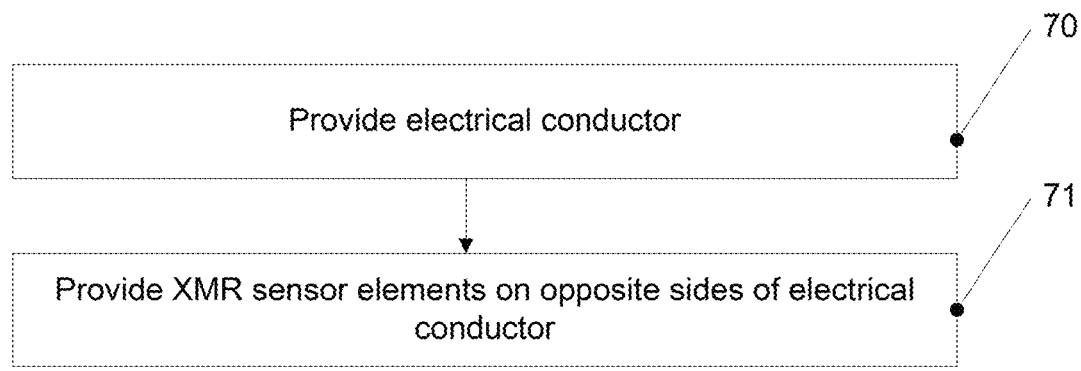
FIG. 7 is a flow chart illustrating a method for manufacturing a device according to an embodiment.

In the following, methods for manufacturing devices according to embodiments, for example the device of FIG. 5, will be discussed. FIG. 7 is a flow chart illustrating a general method for manufacturing devices according to some embodiments.

While the method of FIG. 7 is depicted as a series of acts or events, the order in which these acts or events are described is not to be construed as limiting. Moreover, acts or events described may be split into several separate acts or events.

At 70, the method comprises providing an electrical conductor. The electrical conductor may for example include a bar-shaped conductor.

At 71, the method comprises providing XMR sensor elements on opposite sides of the electrical conductor. The XMR sensor elements may in some embodiments be provided to form a bridge configuration, as illustrated in FIG. 6, for example a bridge configuration with four XMR sensor elements or a bridge configuration with two XMR sensor elements and two resistive elements.

Next, with reference to FIGS. 8 and 9, a further embodiment of a manufacturing method will be discussed, which is one possibility for manufacturing the device shown in FIG. 5. Other manufacturing techniques may also be employed. FIGS. 8(A) to (C) show cross-sectional views of the device of FIG. 5 in various stages of a manufacturing process. FIGS. 9(A) to 9(C) illustrate corresponding top views.

Figures 8A, 8B, 8C, 9A, 9B, 9C:
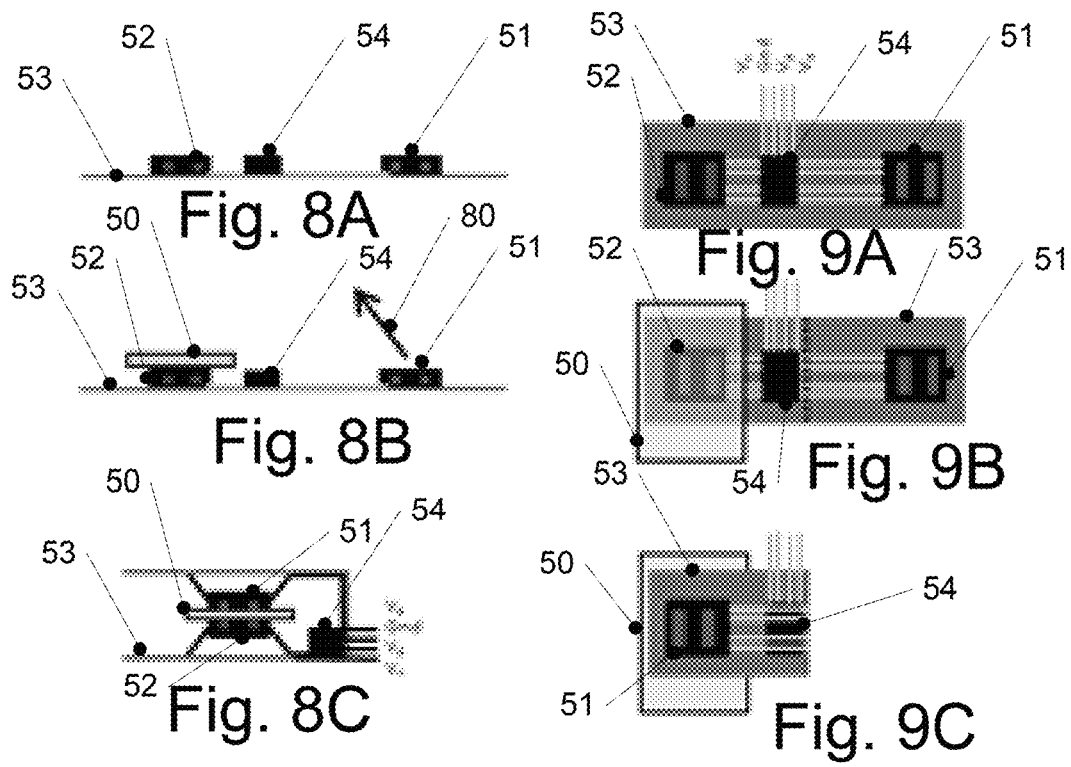
FIGS. 8(A) to (C) illustrate various stages of manufacturing of a device according to an embodiment in cross-section.
FIGS. 9(A) to (C) show plan views of the manufacturing stages of FIGS. 8(A) to (C).

In FIGS. 8(A) and 9(A), first housing 51 with first and second magnetoresistive sensor elements, second housing 52 with third and fourth magnetoresistive sensor elements and plug 54 are provided on carrier 53, which is in this case a flexible printed circuit board (PCB). The printed circuit board, as best seen in the plan view of FIG. 9(A), provides connections between housing 51, 52 and plug 54 to couple the magnetoresistive sensor elements in housings 51, 52 in a bridge configuration as shown in FIG. 6.

In FIGS. 8(B) and 9(B), the electrical conductor 50 is provided on top of second housing 52. Following this, carrier 53 is folded as indicated by an arrow 80 in FIG. 8(B) to arrive at the configuration shown in FIGS. 8(C) and 9(C), where the first and second housings 51, 52, and therefore the sensor elements included therein, are provided on opposite sides of electrical conductor 50.

It should be noted that FIGS. 8 and 9 show merely one example and the device shown in FIGS. 8(C) and 9(C) may also be manufactured in other manners. As a simple example, electrical conductor 50 may be placed on first housing 51 instead of on second housing 52 prior to folding carrier 53, and/or be fixed to first housing 51 and/or second housing 52, for example using an adhesive.

Next, with reference to FIGS. 11-20, various alternatives, variations and modifications to the device of FIG. 5 will be discussed. In order to avoid repetitions, elements already described with reference to FIG. 5, in particular a first housing 51 including first and second magnetoresistive sensor elements, a second housing 52 comprising third and fourth magnetoresistive sensor elements and a plug 54 as well as a conductor 50, will not be described again in detail. Variations and modifications described for these elements with respect to FIG. 5 may also be applied to the embodiments of FIGS. 11-20. Unless noted otherwise, FIGS. 11-20 show cross-sectional views in an xz-plane, where electrical conductor 50 has a rectangular cross-section and current flows perpendicular to the plane shown.

Figure 11:
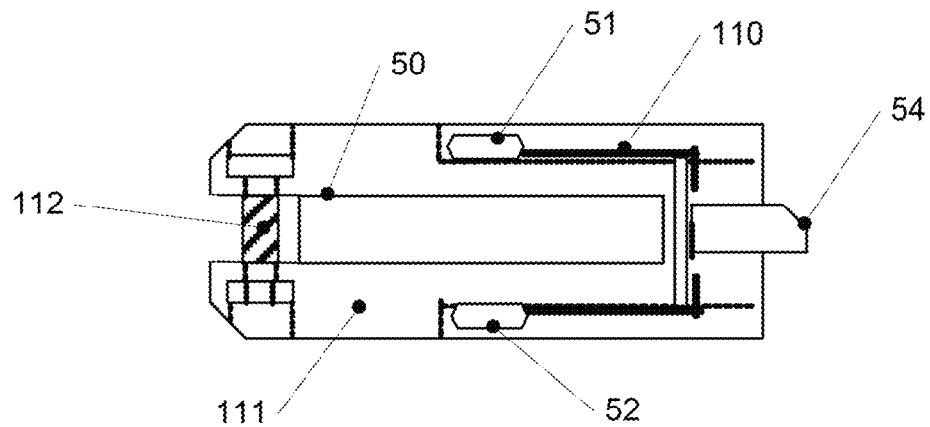
FIGS. 11-20 illustrate various devices according to embodiments.

In the device of FIG. 11, first and second housings 51, 52 as well as plug 54 are mounted in a generally U-shaped bracket 111 and connected by electrical connections 110 (for example wires) to be connected in a desired configuration, for example the bridge configuration of FIG. 6.

The bracket 111 with elements 51, 52, 54 and 110 included may for example be manufactured in a molding process.

To complete the device, conductor 50 is then inserted into bracket 111, and fixed with a screw 112. Both bracket 111 and screw 112 may be made of a plastic material, but are not limited thereto, and in other embodiments, may also be made of a metal material.

In some implementations, a cooling mechanism for cooling electrical conductor 50 and/or first and second housings 51, 52 may be included in bracket 111 or provided in addition to bracket 111. For example, a cooling system with channels for a cooling fluid like water or oil may be provided in bracket 111, through which in operation the cooling fluid then circulates, for example driven by an external pump. Additionally or alternatively, a heat sink may be provided at an outside of bracket 111 with a thermal coupling to bracket 111 and, via bracket 111, to components to be cooled like electrical conductor 50. Such a heat sink may for example comprise a metal block.

Figure 12:
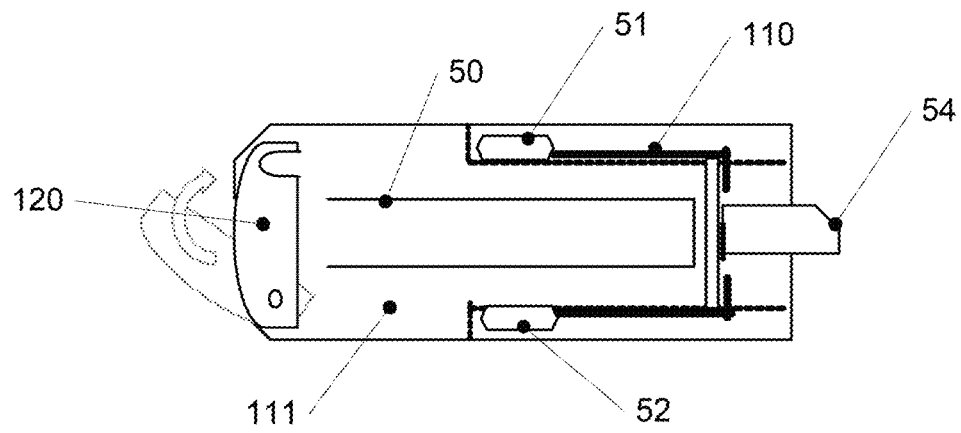

FIG. 12 illustrates a variation the embodiment of FIG. 11, wherein, instead of screw 112, a clip or buckle 120 is provided to hold bracket 111 on electrical conductor 50 after electrical conductor 50 has been inserted into bracket 111. Otherwise, the device of FIG. 12 corresponds to the device of FIG. 11.

Figure 13:
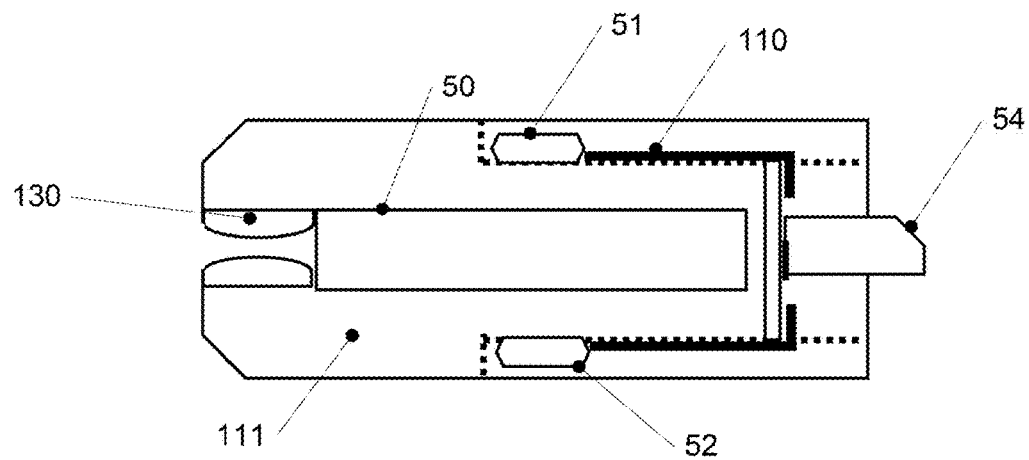

FIG. 13 is a further variation of the embodiment of FIG. 11. In the embodiment of FIG. 13, to keep electrical conductor 50 within bracket 111, protrusions 130 are provided which may have a rounded shape as shown in FIG. 13 or may also have a shape corresponding to barbed hooks. Through resiliency of bracket 111, electrical conductor 50 may be inserted into bracket 111 by moving legs of bracket 111 away from each other, and after the insertion the legs go back to the position shown in FIG. 13, protrusions 130 hold conductor 50 in place.

Figure 14:
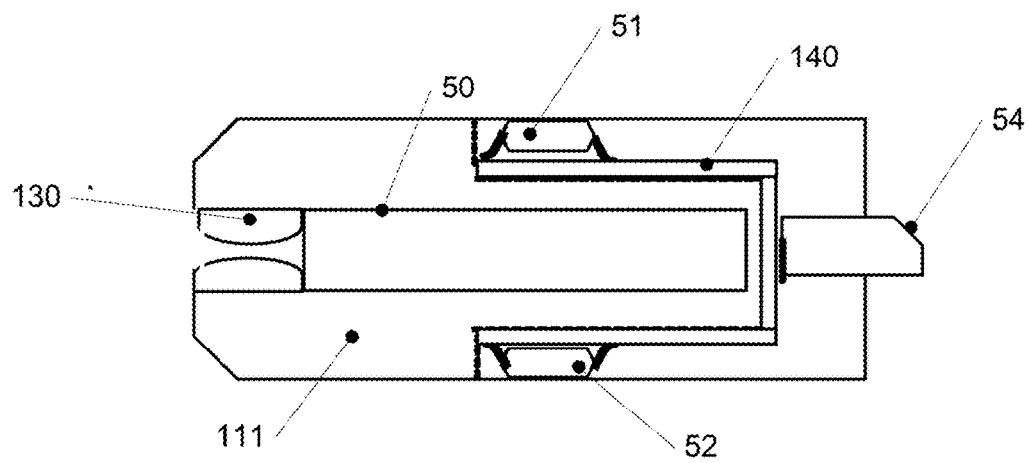

FIG. 14 is a further variation of the embodiment of FIG. 13. Instead of electrical connections 110, in the embodiment of FIG. 14, first and second housings 51, 52 and electrical conductor 50 are mounted to a flexible printed circuit board 140 which provides connections (similar to what is shown in FIG. 9). Printed circuit board 140 together with housings 51, 52 and plug 54 is then incorporated in bracket 111, for example by molding. It should be noted that the same replacement of electrical connections 110 by printed circuit board 140 may also be done for the embodiments of FIGS. 11 and 12.

Figure 15:
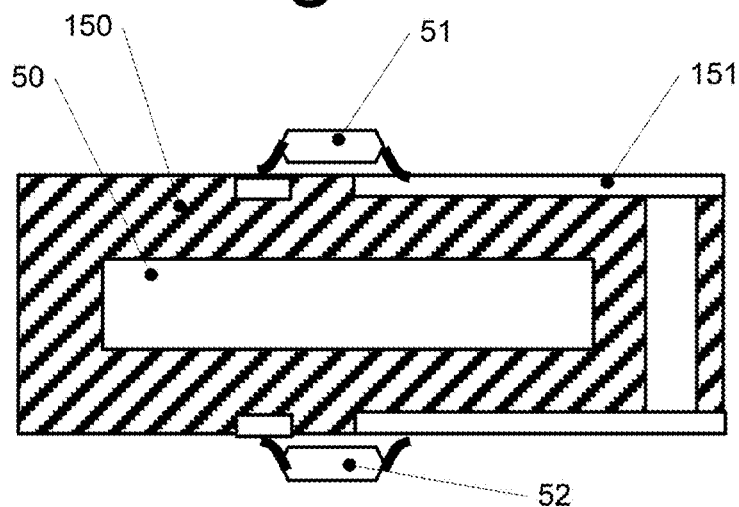

FIG. 15 illustrates a further embodiment. In the embodiment of FIG. 15, electrical conductor 50 is provided through an inlay board 150 having conductors 151 both at a top side and a bottom side thereof. First and second housings 51, 52 with the XMR sensor elements disposed therein are electrically coupled to conductors 151. Conductors 151 then for example provide connection is form of a bridge circuit, as shown in FIG. 6. A plug like plug 54 (not explicitly shown in FIG. 15) then provides electrical connections to further devices.

Figure 16:
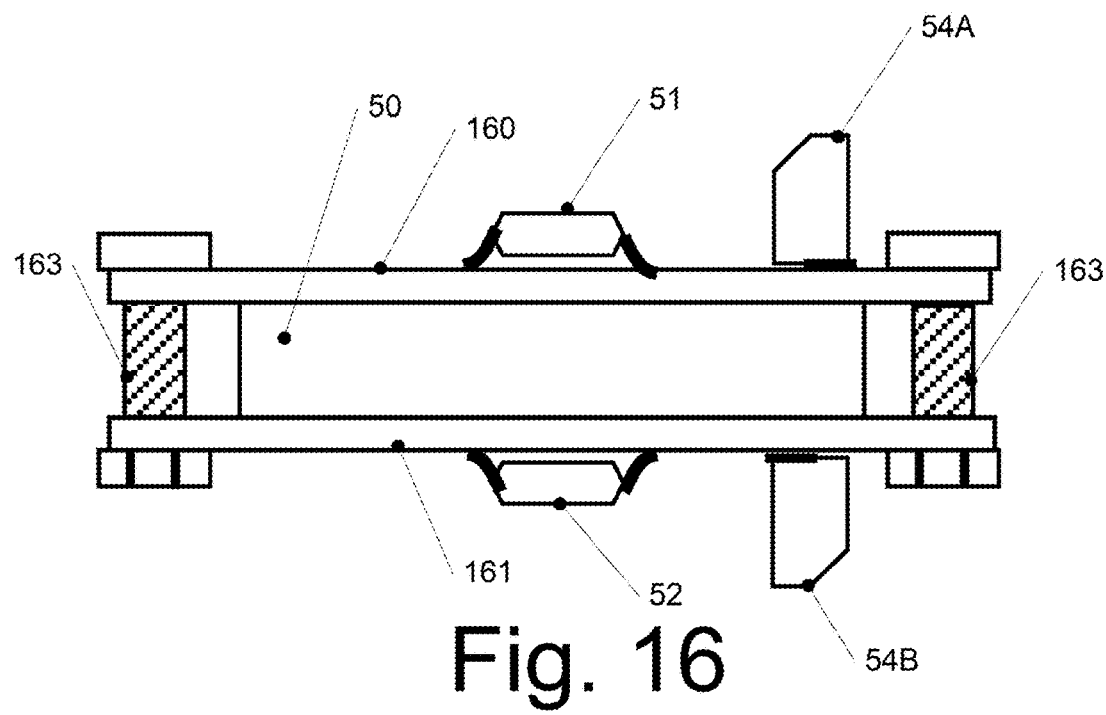

FIG. 16 illustrates a further embodiment. In the embodiment of FIG. 16, a first printed circuit board or DCB (Direct Copper Bonding) board with first housing and a first plug 54A and a second PCB or DCB 161 with second housing 52 and a second plug 54B being mounted thereon are provided. First board 160 is placed on a first side of electrical conductor 50, and second board 161 is placed on a second, opposite side of electrical conductor 50. Then, first and second boards 160, 161 are coupled together via screws 163, which may be plastic screws. Instead of screws, clips or buckles as illustrated in FIG. 12 also may be used. Via plugs 54A, 54B then an electrical connection to the XMR sensor elements in first and second housings 51, 52 is provided. A coupling to a full bridge circuit as shown in FIG. 6 is then performed in another device which is coupled to first and second plugs 54A, 54B.

Figure 17:
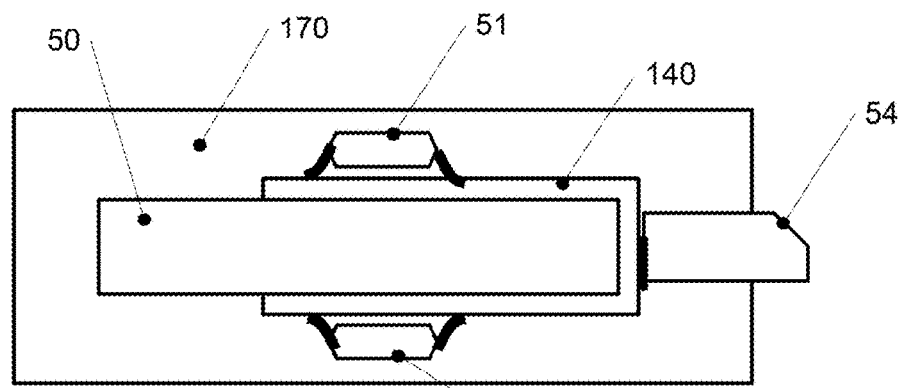

FIG. 17 illustrates a further embodiment. Here, similar to the embodiment of FIG. 14, first and second housings 51, 52 as well as plug 54 are mounted to a flexible printed circuit board 140, which is then "wrapped around" electrical conductor 50 as shown. The resulting arrangement is then overmolded by a third housing 170, thus fixing first and second housings 51, 52 relative to electrical conductor 50.

Figure 18:
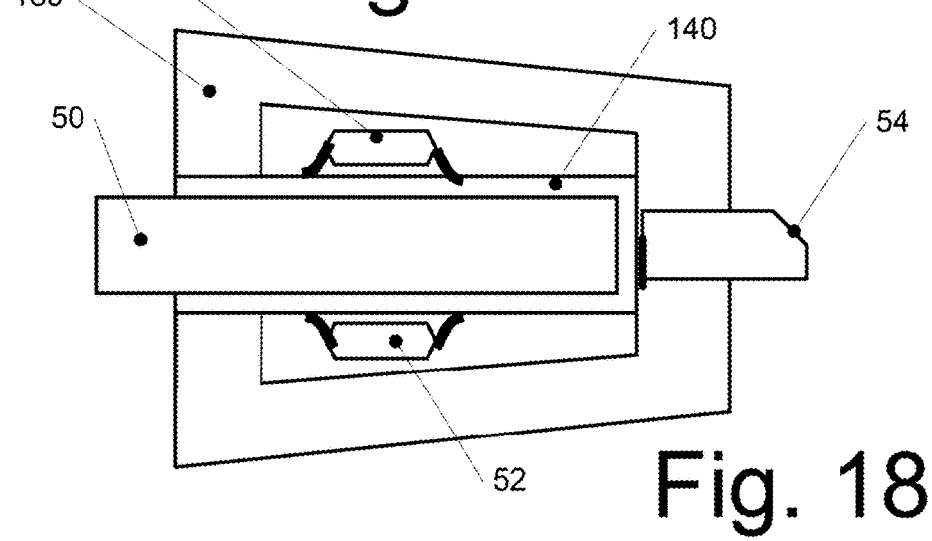

FIG. 18 illustrates a further embodiment. Again, first and second housing 51, 52 as well as a plug 54 are mounted to a flexible printed circuit board 140 providing connections and "wrapped around" electrical conductor 50 as illustrated. A clamp 116 is then provided surrounding first and second housing 51, 52 as shown and clamping printed circuit board 140 to electrical conductor 50 for example based on a resiliency of clamp 180. The exact form of clamp 180 of FIG. 18 is merely an example, and variations are possible as long as printed circuit board 140 is held in place.

Figure 19A:
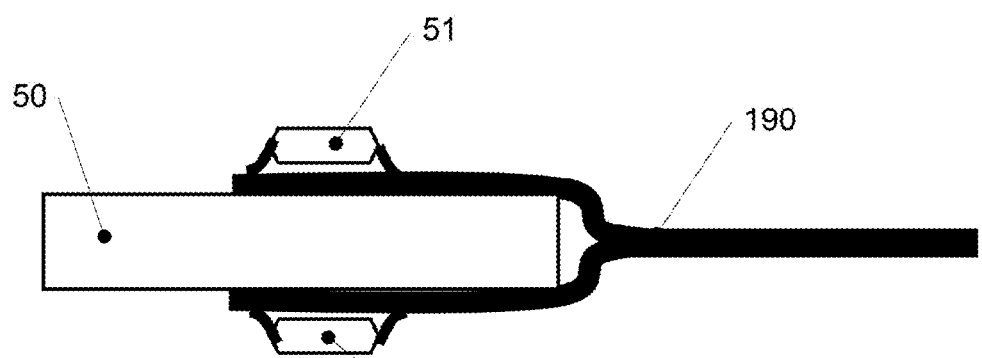
Figure 19B:
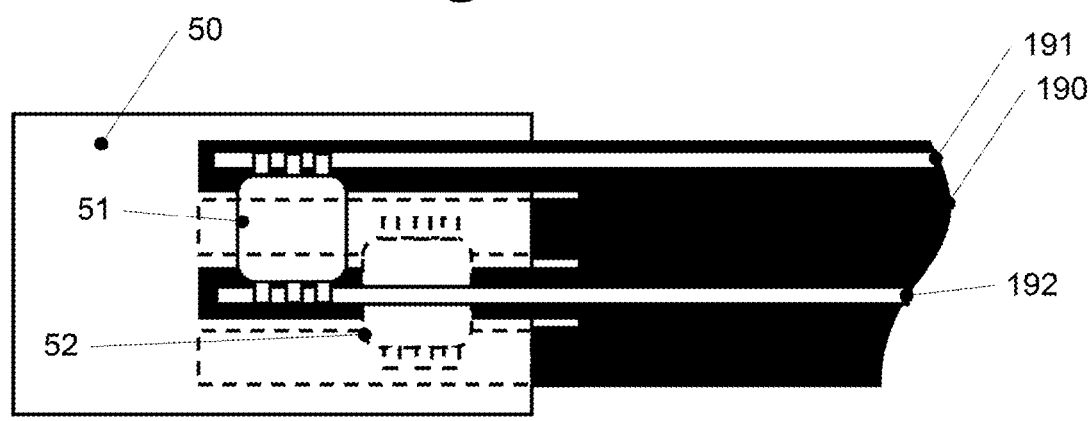

A further embodiment is illustrated in FIGS. 19A and 19B. FIG. 19A shows a cross-sectional view of the embodiment, while FIG. 19B illustrates a plan view. In the embodiment of FIGS. 19A and 19B, a slitted flexible printed circuit board 190 is used. The printed circuit board has slits in the xy-plane, such that, as seen in the cross-sectional view of FIG. 19A, first parts of the printed circuit board carrying first housing 51 are provided on a first side of electrical conductor 50, whereas second parts carrying second housing 52 are provided on a second side of electrical conductor 50. Slitted flexible printed circuit board 190 may be held to electrical conductor 50 due to resiliency of flexible printed circuit board 190, i.e. through internal stress of the plastic, or may be fixed to printed circuit board 50 using an adhesive. Conductors 191 and 192 in or on flexible printed circuit board 190 serve for an electrical connection of the XMR sensor elements in first and second housings 51, 52.

While printed circuit board 190 in the plan view of FIG. 19B is shown as having three slits, such that two stripes of printed circuit board 190 are provided on each side of electrical conductor 50, this is not to be construed as limiting, and different numbers of stripes and slits may also be used.

Figure 20:
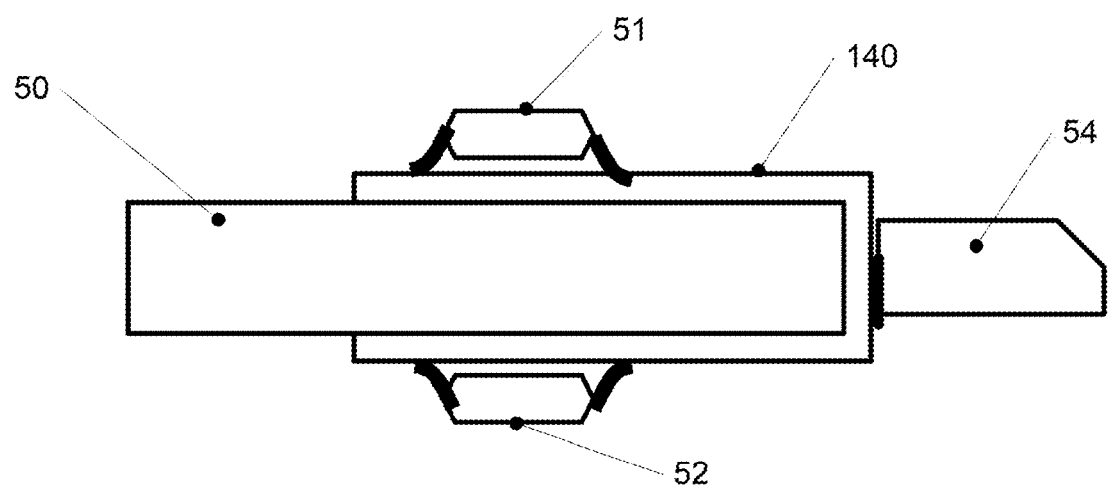

FIG. 20 illustrates a further embodiment of a device. In the device of FIG. 20, first and second housing 51, 52 as well as plug 54 are mounted to a flexible printed circuit board 140 and wrapped around electrical conductor 50. Flexible printed circuit board 140 is then fixed to electrical conductor 50 by an adhesive like a glue or an adhesive tape. In this respect, the embodiment of FIG. 20 is similar to the embodiment of FIG. 5, with the difference that in FIG. 20 the flexible printed circuit board 140 is interposed between housing 51, 52 and electrical conductor 50. In some embodiments, this may improve galvanic isolation.

It should be noted that while FIGS. 8-20 have been described using a configuration with four magnetoresistive sensor elements as an example, they are also applicable to implementations where two magnetoresistive sensor elements and two resistive elements are used.

Some non-limiting embodiments are provided according to the following examples:

EXAMPLE 1

A device, comprising:
an electrical conductor, and
a plurality of magnetoresistive sensor elements, wherein
  a first subset of the plurality of magnetoresistive sensor elements is provided on a first side of the electrical conductor, and a second subset of the plurality of magnetoresistive sensor elements is provided on a second side of the electrical conductor opposite the first side.

EXAMPLE 2

The device of example 1, wherein the first subset comprises a first magnetoresistive sensor element and wherein the second subset comprises a second magnetoresistive sensor element, wherein the device further comprises a first resistive element provided on the first side of the electrical conductor and a second resistive element provided on the second side of the electrical conductor, wherein the first and second resistive elements are essentially insensitive to a magnetic field.

EXAMPLE 3

The device of example 2, wherein the first and second magnetoresistive sensor elements and first and second resistive elements are electrically coupled in a bridge configuration.

EXAMPLE 4

The device of example 1, wherein the first subset comprises a first magnetoresistive sensor element and a second magnetoresistive element, and wherein the second subset comprises a third magnetoresistive sensor element and a fourth magnetoresistive element.

EXAMPLE 5

The device of example 4, wherein the first through fourth magnetoresistive sensor elements are electrically coupled in a bridge configuration.

EXAMPLE 6

The device of any one of examples 1-5, wherein the first subset is provided in a first housing, and the second subset is provided in a second housing.

EXAMPLE 7

The device of any one of examples 1-6, wherein the plurality of magnetoresistive sensor elements is provided on a flexible printed circuit board, wherein the flexible printed circuit board at least partly surrounds the electrical conductor.

EXAMPLE 8

The device of example 7, wherein the plurality of magnetoresistive sensor elements is located between the electrical conductor and the flexible printed circuit board.

EXAMPLE 9

The device of example 7, wherein the flexible printed circuit board is interposed between the plurality of magnetoresistive sensor elements and the electrical conductor.

EXAMPLE 10

The device of any one of examples 1-6, wherein the first subset is provided on a first board, wherein the second subset is provided on a second board, wherein the electrical conductor is interposed between the first and second boards.

EXAMPLE 11

The device of example 10, wherein the first and second boards are coupled via fixation elements.

EXAMPLE 12

The device of any one of examples 1-10, further comprising a bracket, wherein the plurality of magnetoresistive sensor elements is provided in the bracket, wherein the electrical conductor is inserted into the bracket.

EXAMPLE 13

The device of example 12, further comprising a holding element configured to hold the conductor in the bracket.

EXAMPLE 14

The device of any one of examples 1-13, further comprising a molding surrounding the plurality of magnetoresistive sensor elements and the electrical conductor.

EXAMPLE 15

The device of any one of examples 1-14, wherein the electrical conductor is a bar-shaped conductor.

EXAMPLE 16

A method, comprising:
providing an electrical conductor, and
providing magnetoresistive sensor elements on opposite sides of the electrical conductor.

EXAMPLE 17

The method of example 16, further comprising providing the plurality of magnetoresistive sensor elements on a flexible printed circuit board, wherein providing the electrical conductor comprises providing the electrical conductor on a first subset of the plurality of magnetoresistive sensor elements, and wherein providing the magnetoresistive sensor elements on opposite sides of the electrical conductor comprising folding the flexible printed circuit board around the electrical conductor.

EXAMPLE 18

The method of example 17, further comprising fixing the flexible printed circuit board to the electrical conductor.

EXAMPLE 19

The method of any one of examples 16-18, further comprising coupling the plurality of magnetoresistive sensor elements to a bridge configuration.

EXAMPLE 20

The method of any one of examples 16-19, further comprising providing a bracket including the plurality of magnetoresistive sensor elements, wherein providing the magnetoresistive sensor elements on opposite sides of the electrical conductor comprises inserting the electrical conductor into the bracket.

EXAMPLE 21

A device, comprising:
an electrical conductor,
a first housing comprising a first magnetoresistive sensor element and a first resistive element, wherein the first housing is provided on a first side of the electrical conductor,
a second housing comprising a second magnetoresistive sensor element and a second resistive element, the second housing being provided on a second side of the electrical conductor opposite the first side, and
electrical connections connecting the first and second magnetoresistive sensor elements and first and second resistive elements in a bridge configuration.

EXAMPLE 22

The device of example 21, wherein the first and second resistive elements are one of magnetoresistive elements or resistive elements essentially insensitive to magnetic fields.

As can be seen from the above devices, examples and embodiments, a plurality of variations and implementations are possible for providing XMR sensor elements on opposite sides of an electrical conductor. Therefore, the above described embodiments are not to be construed as limiting.

What is claimed is:

1. A method comprising:
providing a plurality of magnetoresistive sensor elements on opposite sides of an electrical conductor; and
providing the plurality of magnetoresistive sensor elements on a flexible printed circuit board,
wherein the electrical conductor is provided on a subset of the plurality of magnetoresistive sensor elements, and
wherein providing the plurality of magnetoresistive sensor elements on the opposite sides of the electrical conductor comprises folding the flexible printed circuit board around the electrical conductor.

2. The method of claim 1, further comprising fixing the flexible printed circuit board to the electrical conductor.

3. The method of claim 2, wherein fixing the flexible printed circuit board to the electrical conductor comprises fixing the flexible printed circuit board to the electrical conductor using a glue or an adhesive tape.

4. The method of claim 1, further comprising coupling the plurality of magnetoresistive sensor elements to a bridge configuration.

5. The method of claim 1, further comprising forming a molding surrounding the plurality of magnetoresistive sensor elements, the flexible printed circuit board, and the electrical conductor.

6. The method of claim 1, wherein providing the plurality of magnetoresistive sensor elements on opposite sides of the electrical conductor comprises positioning the plurality of magnetoresistive sensor elements between the electrical conductor and the flexible printed circuit board.

7. The method of claim 1, wherein providing the plurality of magnetoresistive sensor elements on opposite sides of the electrical conductor comprises interposing the flexible printed circuit board between the plurality of magnetoresistive sensor elements and the electrical conductor.

8. A device, comprising:
an electrical conductor;
a flexible printed circuit board at least partly surrounding the electrical conductor;
a first housing provided on the flexible printed circuit board, the first housing comprising a first magnetoresistive sensor element and a first resistive element, wherein the first housing is provided on a first side of the electrical conductor;
a second housing provided on the flexible printed circuit board, the second housing comprising a second magnetoresistive sensor element and a second resistive element, the second housing being provided on a second side of the electrical conductor opposite the first side; and
electrical connections configured to connect the first and second magnetoresistive sensor elements and the first and second resistive elements in a bridge configuration.

9. The device of claim 8, wherein the first and second magnetoresistive sensor elements and first and second resistive elements are electrically coupled in a bridge configuration.

10. The device of claim 8,
wherein the first housing comprises a third magnetoresistive sensor element, and
wherein the second housing comprises a fourth magnetoresistive element.

11. The device of claim 10, wherein the first through fourth magnetoresistive sensor elements are electrically coupled in a bridge configuration.

12. The device of claim 8, further comprising a molding surrounding the first and second housings, the flexible printed circuit board, and the electrical conductor.

13. The device of claim 8, wherein the electrical conductor is a bar-shaped conductor.

14. The device of claim 8, wherein the first and second resistive elements are one of magnetoresistive elements or resistive elements that are essentially insensitive to magnetic fields.

15. The device of claim 8, wherein the flexible printed circuit board comprises a slitted flexible printed circuit board.

16. The device of claim 8, wherein the flexible printed circuit board is fixed to the electrical conductor using a glue or an adhesive tape.

17. The device of claim 8,
wherein the first housing is located between the electrical conductor and the flexible printed circuit board, and
wherein the second housing is located between the electrical conductor and the flexible printed circuit board.

18. The device of claim 8,
wherein the flexible printed circuit board is interposed between the first housing and the electrical conductor, and
wherein the flexible printed circuit board is interposed between the second housing and the electrical conductor.

19. The device of claim 8, further comprising a clamp surrounding the first and second housings, wherein the clamp presses the flexible printed circuit board to the electrical conductor.

20. The device of claim 8, wherein the first and second housings, the electrical conductor, and the flexible printed circuit board are mounted in a bracket.

21. The device of claim 20, wherein the bracket comprises a cooling mechanism including a channel for a cooling fluid.

22. A device comprising:
an electrical conductor;

a flexible printed circuit board at least partly surrounding the electrical conductor;

a bracket including protrusions to hold the electrical conductor in place;

a first housing provided on the flexible printed circuit board, the first housing comprising a first magnetoresistive sensor element and a first resistive element, wherein the first housing is provided on a first side of the electrical conductor;

a second housing provided on the flexible printed circuit board, the second housing comprising a second magnetoresistive sensor element and a second resistive element, the second housing being provided on a second side of the electrical conductor opposite the first side; and electrical connections configured to connect the first and second magnetoresistive sensor elements and the first and second resistive elements in a bridge configuration, wherein the first and second housings, the electrical conductor, and the flexible printed circuit board are mounted in the bracket by molding.

* * * * *